United States Patent [19]

Thompson et al.

[11] 3,992,989

[45] Nov. 23, 1976

[54] VARIABLE PATTERN SCREEN PRINTER

[76] Inventors: Hugh L. Thompson, P.O. Box 2329; George A. Wendlend, P.O. Box 1019, both of Waco, Tex. 76703

[22] Filed: May 12, 1975

[21] Appl. No.: 576,620

[52] U.S. Cl. .................. 101/112; 101/123; 101/127; 101/127.1

[51] Int. Cl.² .................. B41F 15/34; B41J 3/22

[58] Field of Search .................. 101/127, 127.1, 128, 101/128.1, 112, 123, 126

[56] References Cited

UNITED STATES PATENTS

| | | | |
|---|---|---|---|
| 80,711 | 8/1868 | Barry | 101/112 |
| 125,788 | 4/1872 | Chamberlain | 101/112 X |
| 2,943,562 | 7/1960 | Phillips et al. | 101/126 X |
| 3,007,396 | 11/1961 | Govan | 101/123 X |

*Primary Examiner*—Edgar S. Burr
*Assistant Examiner*—R. E. Suter
*Attorney, Agent, or Firm*—Jones, Thomas & Askew

[57] ABSTRACT

The variable pattern screen printer includes a support frame defining a central opening and a plurality of elongated patterned printing screens movable through the support frame across the opening. The individual printing screens are independently moved along their lengths to select the desired pattern and ink is applied through the screens to a work product. The pattern carried by the printing screens can be a series of numbers or letters or a combination thereof, or any other design series.

8 Claims, 4 Drawing Figures

VARIABLE PATTERN SCREEN PRINTER

BACKGROUND OF THE INVENTION

In the typical screen printing processes, a screen having a pattern thereon is applied to a work product, dye or ink is placed on the screen, and the dye is urged through the screen to the surface of the work product by wiping the dye against the screen with a squeegee, etc. While screen printing has been used for many years in printing constant designs, considerable inconvenience is encountered when the pattern to be printed is to be changed. The screens are usually individually mounted or supported on the work product, so that when a new design is to be applied by the worker, the screen previously used must be set aside and another screen selected and used in the process. In situations where it is desirable to number or letter work products in sequence, the worker must change the individual number or letter screen on each cycle of printing, and a large supply of letters or numbers must be maintained at hand and handled for use in the process. When a variable screen printing process must be used at different locations, the several letter and number screens, the squeegee and other equipment must be collected and transported to the location where the process is to be performed. The letter and number screens are subject to being lost, damaged or becoming out of sequential order, and the worker may find it difficult to handle all of the elements of the system in some locations.

SUMMARY OF THE INVENTION

Briefly described, the present invention comprises a variable pattern screen printer that includes a support frame defining a central opening therethrough and a plurality of elongated pattern printing screens positioned in parallel side-by-side relationship and extending across the central opening of the support frame. Each of the elongated pattern printing screens is slidable through the support frame so as to present different patterns in the opening of the support frame. The patterns in the screen material can be numerals, letters, artistic designs or various other patterns. The width of the printing screens can be varied when larger or smaller designs are being printed, the number of printing screens carried by the support frame can be varied, and some of the spaces for the printing screens can be covered to prevent the worker from printing through the covered portion. The support frame and printing screens include a detent alignment system for aligning the designs of each printing screen with the designs of the other printing screens.

Thus, it is an object of the present invention to provide a variable pattern screen printer which is suitable for printing numbers and letters in sequence on sequential work pieces and which maintains all of the numbers or letters immediately available for movement into the printing area.

Another object of the present invention is to provide the variable pattern screen printer which is inexpensive to manufacture, convenient to use, which is portable, and which enables the worker to accurately and to expediently apply a variable pattern to a work product.

Other objects, features and advantages of the present invention will become apparent upon reading the following specification when taken in conjunction with the accompanying drawing.

DETAILED DESCRIPTION OF AN EMBODIMENT

Figure 1:
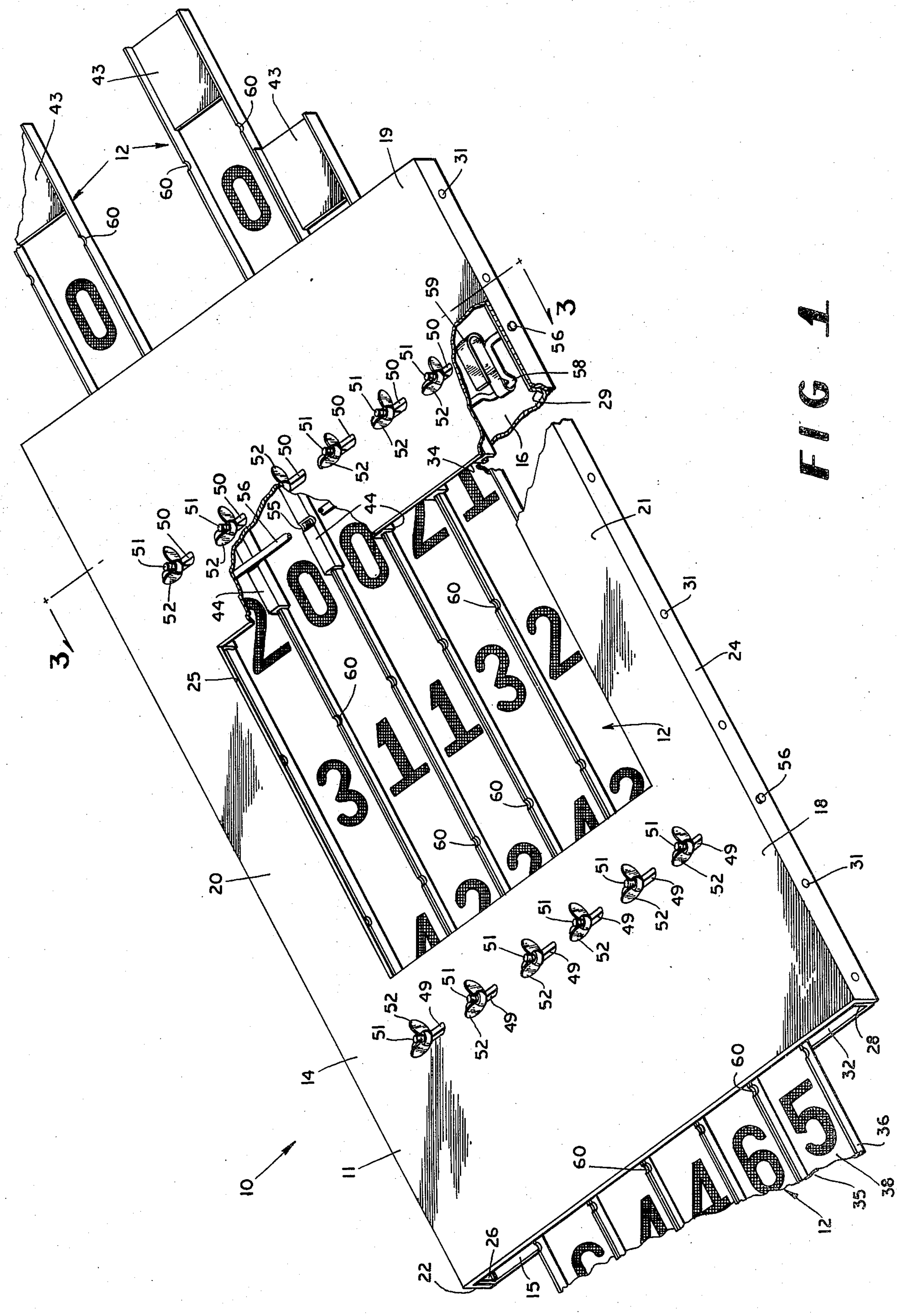
FIG. 1 is a perspective view of the variable pattern screen printer, with parts broken away and with the ends of the printing screens removed.

Referring now in more detail to the drawing, in which like numerals indicate like parts throughout the several views, FIG. 1 illustrates the variable pattern screen printer 10 which includes a support frame 11 and a plurality of elongated pattern printing screens 12. Support frame 11 is rectangular and includes upper sheet 14 and a pair of lower sheets 15 and 16. Upper sheet 14 includes end portions 18 and 19, side portions 20 and 21, and downwardly turned side flanges 22 and 24. Rectangular opening 25 is formed between the end portions 18 and 19 and side portions 20 and 21. Lower sheets 15 and 16 are positioned beneath end portions 18 and 19 of the upper sheet 14 and each includes upwardly turned side flanges 26 and 28, and 29 and 30. The side flanges of the lower sheets 15 and 16 are telescoped into the side flanges 22 and 24 of the upper sheet 14 and are connected together by screws 31 or similar conventional connectors. With this arrangement, lower sheet 15 defines with upper sheet 14 a slot 32 and lower sheet 16 defines with upper sheet 14 a slot 34, with the slots 32 and 34 being in alignment with each other and positioned on opposite sides of the rectangular opening 25 of the support frame 11. There is no lower sheet in the support frame structure beneath the rectangular opening 25 in the upper sheet 14.

Each of the printing screens 12 comprises a pair of rectilinear parallel side frame elements 35 and 36 which are L-shaped in cross section and screen material 38 extends between the side frame elements. The L-shaped side frame elements 35 and 36 are oriented so that each has an upright leg 39 and 40 and the others of their legs 41 and 42 extend toward each other in a common plane. The screen material 38 is mounted on a surface of the legs 41 and 42 which are in a common plane, so that the legs 41 and 42 function as screen material support surfaces. Rigid spacers 43 are connected to the pairs of side frame elements 35 and 36 at opposite ends of the frame elements to maintain the frame elements in constant spaced apart relationship, so that the assembled frame elements 35 and 36 and spacers 43 function as a stretcher frame for the screen material 38.

Each printing screen 12 is insertable in and is slidable through the aligned slots 32 and 34 of the support frame 11, with the printing screens being arranged in parallel, side-by-side relationship with respect to one another, and with each printing screen extending across the rectangular opening 25 of the support frame. A plurality of guide elements 44 are carried by the upper sheet 14 of the support frame 11 on both sides of rectangular opening 25. Each guide element 44 is formed from channel stock and is U-shaped in cross section, with a base 45 and downwardly extending side legs 46 and 48. A plurality of aligned slots 49 are formed in and extend across end portion 18, and a similar plurality of aligned slots 50 are formed in and extend across the end portion 19 of the upper sheet 14 of the support frame 11. The guide elements 44 are each connected to the upper sheet 14 by means of a screw 51 extending through an opening in the base 45 of the guide element and through one of the slots of the aligned slots 49 and 50, with a wing nut or other screw tightening member 52 threaded onto the screw 51. The guide elements 44 are aligned with the lengths of the printing screens 12 and the side legs 46 and 48 of the guide elements extend from the underside of upper sheet 14 toward the lower sheet 15 for a distance less than the depth of slots 32 and 34, so that the lower edges of the guide elements do not engage lower sheets 15 and 16. The upwardly extending legs 39 and 40 of the L-shaped frame elements 35 and 36 of each printing screen 12 is slidable into a guide element 44, and the width of each of the guide elements is sufficient to accommodate a pair of the abutting upwardly extending legs 39 and 40. Thus, guide elements 44 function as guide means for guiding each printing screen along its length through the support frame.

The arrangement of the plurality of aligned slots 49 and 50 and the wing nut connectors of the guide elements 44 enables the guide elements 44 to be moved across the length of the support frame 11, so that the guide elements 44 can be repositioned and receive printing screens of different widths. For example, a smaller number of wider printing screens can be received in the support frame, or printing screens of different widths can be used in the support frame.

Each guide element 44 defines a notch 55 through its base 45 and down into its side legs 46 and 48, and the notches 55 of the guide elements 44 are in alignment with one another across the length of the support frame 11. A pair of retaining rods 56 extend across the length of the support frame 11 on opposite sides of the rectangular opening 25 and each retaining rod 56 is received in the aligned notches 55 of the guide elements 44. The end portions of each retaining rod 56 include a modified U-shaped bend 58 (FIG. 1), and the offset distal ends of each rod 56 extends through the side flanges 22, 24, 26 and 28 of the upper and lower sheets 14 and 15 of the support frame and therefore pivotally supports the central length of the retaining rod in the slot of the support frame. Leaf springs 59 bias the bends 58 and the central length of each retaining rod 56 downwardly away from the upper sheet 14, and the central length of each retaining rod is therefore urged down into the aligned notches 55 of the guide elements 44.

A plurality of notches 60 are also formed in the upper edges of the upright legs 39 and 40 of the L-shaped side frame elements 35 and 36 of the printing screens 12. The notches 60 are equally spaced along the length of the side frame elements of the printing screens and are registrable with the notches 55 of the guide elements 44. When a plurality of notches 60 are aligned with a plurality of notches 55, the central lengths of the retaining rods 56 will be moved downwardly by springs 59 away from the upper sheets 14 into the notches 60. The force applied by the retaining rods 56 in the notches 60 tends to retain the printing screens 12 in a set position. If one of the printing screens 12 is urged along its length through the support frame 11, the longitudinal force applied to the printing screen will push the retaining rod 56 up out of the notch 60 so that the printing screen is free to move longitudinally with respect to the support frame 11.

The screen material 38 of each printing screen 12 can be fabricated from the usual suitable screen materials; however, in the illustrated embodiment the screen material is stainless steel wire mesh. The side frame elements 35 and 36 of the printing screen are fabricated from a material that does not absorb the ink or dye that is to be used with the screen printer, with the embodiment illustrated being fabricated of stainless steel. The stainless steel wire mesh 38 is welded or braised at its edges to the side frame elements. The spacers 44 at the ends of the printing screens 12 are fabricated from flat stainless steel. While various dyes can be used with these elements disclosed herein, the preferred dye is a plastisol ink that does not dry unless subjected to heat. Of course, other dyes can be used which are compatible to the elements of the invention and which may be suitable to the work product.

Figure 2:
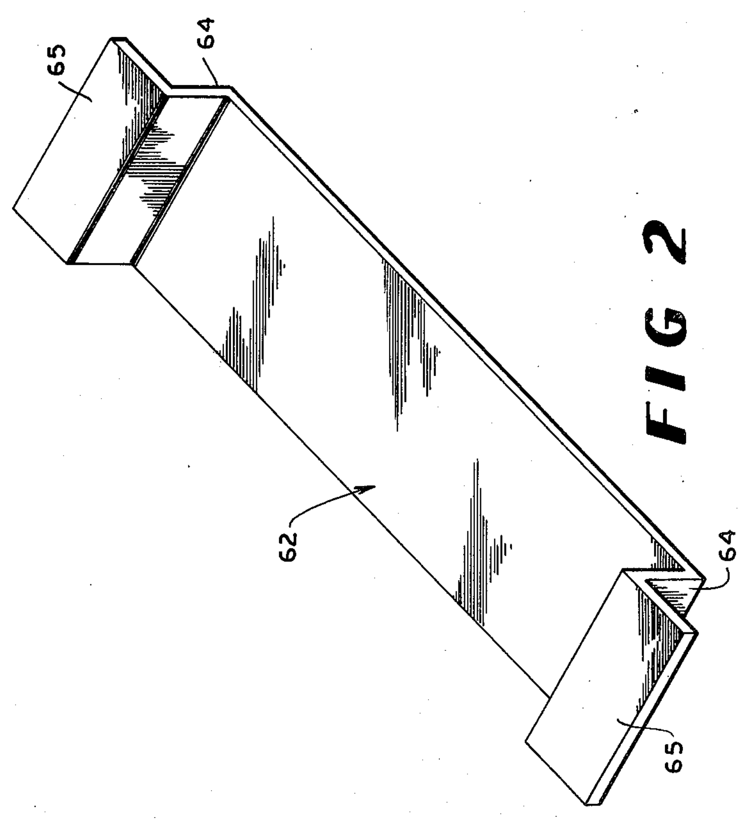
FIG. 2 is a perspective view of a cover which is insertable over one of the printing screens in the opening of the frame of the variable pattern screen printer.

In the event that all of the printing screens 12 are not to be used in a particular application, one or more covers 62 can be inserted in the rectangular opening 25 to occupy a portion of the space in the opening. As is illustrated in FIG. 2, the cover 62 comprises a flat sheet turned upwardly at 64 and outwardly at 65 at both of its ends, so that the main body portion of the cover can be inserted into the rectangular opening 25 of the support frame with the bends 64 and 65 retaining the cover in the rectangular opening and inside the rectilinear parallel side frame elements 35 and 36 of one of the printing screens 12. Thus, when a cover 62 is positioned over a printing screen 12, the worker is not likely to inadvertently apply dye to the covered printing screen, and if he should accidently apply dye toward the covered printing screen, the cover 62 would keep the dye from passing to the printing screen. Also, the covered printing screen is still able to move longitudinally through the support frame 11.

Figure 4:
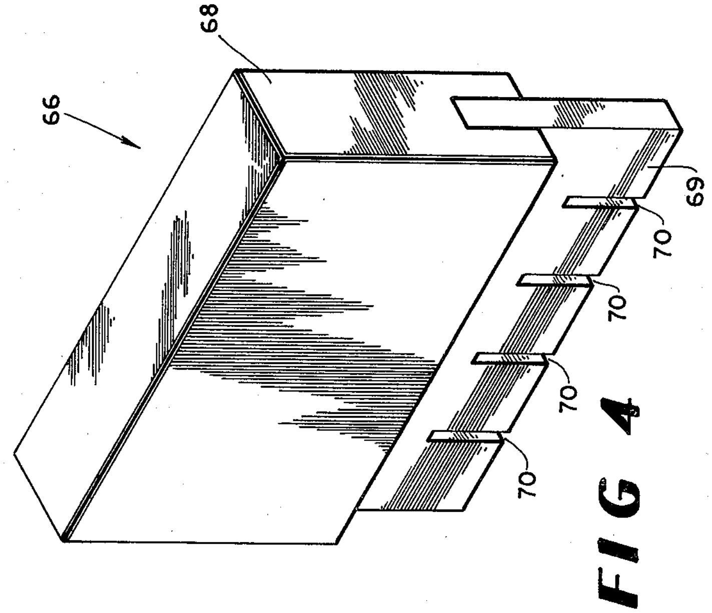
FIG. 4 is a perspective view of a squeegee useable with the variable pattern screen printer.

As is illustrated in FIG. 4, a squeegee or spreader 66 is provided for conveniently spreading the dye or ink on the printing screens 12. The squeegee comprises a handle 68 and a flexible squeegee blade 69. A plurality of slots 70 are formed in squeegee blade 69, with the spacing of the slots 70 corresponding to the spacing of the side frame elements 35 and 36 of each printing screen 12. When dye is placed on the printing screens 12, the squeegee is inserted through the rectangular opening 25 of the support frame toward engagement with the screen material of the printing screens and the slots 70 of the squeegee are inserted about the upright legs 39 and 40 of side frame elements 35 and 36 of each printing screen so that the blade surface of the squeegee 66 makes contact with the screen material. The squeegee is moved longitudinally along the printing screens to wipe or squeegee the dye through the screen material and onto the work product. The printing screens 12 are restrained from lontitudinal movement during the wiping action by the retaining rod 56 during the wiping process.

The screen material 38 can include a pattern of sequential numbers as illustrated in FIG. 1, with the numbers being spaced apart a distance sufficient to allow the spreading of the dye without having the dye inadvertently spread to adjacent ones of the numbers. As previously stated, other patterns can be formed in the screen material, such as letters of the alphabet and artistic designs. If a sequence of numbers, letters or other designs is to be applied by the screen printer, the worker can easily slide the various ones of the printing screens 12 along the lengths through the support frame to change the design.

Figure 3:
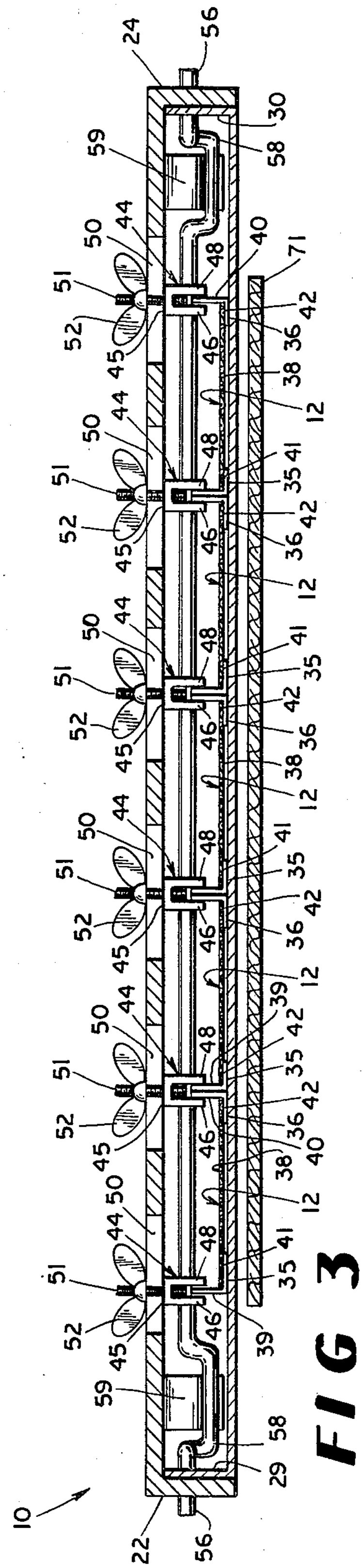
FIG. 3 is an end cross-sectional view of the variable pattern screen printer, taken along lines 3—3 of FIG. 1.

The work product 71 (FIG. 3) to which the dye is applied can be virtually any object, such as woven or knitted materials, a hard wall or floor surface or a tufted carpet. The dye which is to be used with the screen printer should be compatible with the workpiece 71. The screen printer illustrated herein is portable and can be carried to virtually any location for printing on objects; however, it will be understood that the screen printer can be mounted in a permanent support and made so that it is movable toward and away from a platen area where various workpieces will be positioned.

While this invention has been described in detail with particular reference to a preferred embodiment thereof, it will be understood that variations and modifications can be effected within the spirit and scope of the invention as described hereinbefore and as defined in the appended claims.

We claim:

1. Apparatus for screen printing on a surface comprising a support frame defining a central opening, a plurality of elongated patterned printing screens positioned in parallel side-by-side relationship and extending across the central opening of said support frame, each of said printing screens including parallel side frame elements and screen material extending between said side frame elements, each of said side frame elements including a leg member extending approximately at a right angle with respect to said screen material, said support frame including a plurality of guide elements engaging the leg members of said side frame elements whereby each of said printing screens is movable along its length independently of the other printing screens through the guide elements in said support frame to move different portions of its pattern into the opening of said support frame.

2. The apparatus of claim 1 and wherein said side frame elements define a series of equally spaced notches therein and said support frame includes means for registering with the notches of said side frame elements to restrain longitudinal movement of said screens through said support frame.

3. The apparatus of claim 1 and further including a squeegee including a squeegee blade for wiping against the screen material of said printing screens, said squeegee blade defining slots at spaced intervals for insertion about the leg members of said side frame elements.

4. Apparatus for screen printing comprising a support frame defining an opening therethrough, a plurality of elongated patterned printing screens positioned in parallel side-by-side relationship and spanning the opening of said support frame, each of said printing screens comprising a stretcher frame and screen material stretched across the stretcher frame, each of said stretcher frames including rectilinear side frame elements extending approximately normal to the screen material of said printing screens, channel-shaped guide means carried by said support frame for engaging and guiding the rectilinear side frame elements of said stretcher frames of said printing screens with respect to said support frame whereby each printing screen is independently movable along its length through said support frame.

5. The apparatus of claim 4 and wherein said guide means are mounted on said support frame and are movable with respect to said support frame in a direction transverse to said screen length to guide said stretcher frames at different positions with respect to said support frame.

6. The apparatus of claim 4 and wherein each of said elongated patterned printing screens includes a series of patterns equally spaced along its length, and means for maintaining the patterns of adjacent printing screens in alignment with one another across the opening of the support frame.

7. The apparatus of claim 4 and wherein each channel-shaped guide means is sized to receive a pair of rectilinear side frame elements and engages rectilinear side frame elements of adjacent ones of said stretcher frames.

8. Apparatus for screen printing on a surface comprising a support frame defining a central opening, a plurality of elongated patterned printing screens positioned in parallel side-by-side relationship and extending across the central opening of said support frame, each of said printing screens including a pair of rectilinear parallel side frame elements L-shaped in cross section and oriented with a first leg of each side frame element extending in a common plane with one another and a second leg of each side frame element extending at a right angle with respect to said first legs, and screen material extending between and supported by said first legs of said side frame elements, U-shaped guide elements supported by said support frame with said guide elements extending about the second legs of said side frames whereby each of said printing screens is movable along its length independently of the other screens in said support frame to move different portions of its pattern into the opening of said support frame.

* * * * *